(12) United States Patent
Franck

(10) Patent No.: US 6,278,321 B1
(45) Date of Patent: Aug. 21, 2001

(54) METHOD AND APPARATUS FOR AN IMPROVED VARIABLE GAIN AMPLIFIER

(75) Inventor: Stephen Franck, Felton, CA (US)

(73) Assignee: Infineon Technologies Corporation, San Jose, CA (US)

( * ) Notice: Subject to any disclaimer, the term of this patent is extended or adjusted under 35 U.S.C. 154(b) by 0 days.

(21) Appl. No.: 09/422,812

(22) Filed: Oct. 21, 1999

(51) Int. Cl.[7] .................................. H03F 3/45; H03F 1/14
(52) U.S. Cl. ........................... 330/254; 330/260; 330/292
(58) Field of Search ..................... 330/252, 253, 330/254, 258, 259, 260, 292; 360/46, 67, 68

(56) References Cited

U.S. PATENT DOCUMENTS

| | | | |
|---|---|---|---|
| 5,384,501 | * 1/1995 | Koyama et al. | 330/253 X |
| 5,386,328 | * 1/1995 | Chiou et al. | 360/68 |
| 5,852,526 | * 12/1998 | Huntington | 360/46 X |
| 5,894,234 | * 4/1999 | Morris | 330/260 X |

OTHER PUBLICATIONS

"Alpha Introduces The Only Adjustable Shunt Regulator With Superior Performance In Small Outline Surface Mount SOT-23," *Alpha Seminconductor Press Release*, Oct. 29, 1998.

Welland et al., "A Digital Read/Write Channel with EEPR4 Detection," *ISSCC Dig. Tech. Papers*, Feb. 1994, pp. 276–277.

Gopinathan et al., "A 2.5V, 30MHz–100MHz, 7th–Order, Equiripple Group–Delay Continuous–Time Filter and Variable–Gain Amplifier Implemented in 0.25$\mu$m CMOS," *1999 International Solid–State Circuits Conference*, 1999, WA 23.2.

Vishakhadatta et al., "An EPR4 Read/Write Channel with Digital Timing Recovery," *IEEE J. Solid–State Circuits*, vol. 33, No. 11 Nov. 1998, pp. 1851–1857.

F. Krummenacher, "A 4MHz Continuous–time filter with on–chip automatic tuning," *IEEE Journal of Solid–State Circuits*, vol. SC–23, pp. 750–758, Jun. 1988.

* cited by examiner

Primary Examiner—Steven J. Mottola
(74) Attorney, Agent, or Firm—Fish & Richardson P.C.

(57) ABSTRACT

A method and apparatus for a variable gain amplifier has a well-regulated common mode output. The invention has particular applications to CMOS integrated circuits and has other applications. In a specific embodiment, the invention is used with a regulated voltage source that has good stability over a wide bandwidth of load changes.

20 Claims, 6 Drawing Sheets

Variable Gain Amplifier

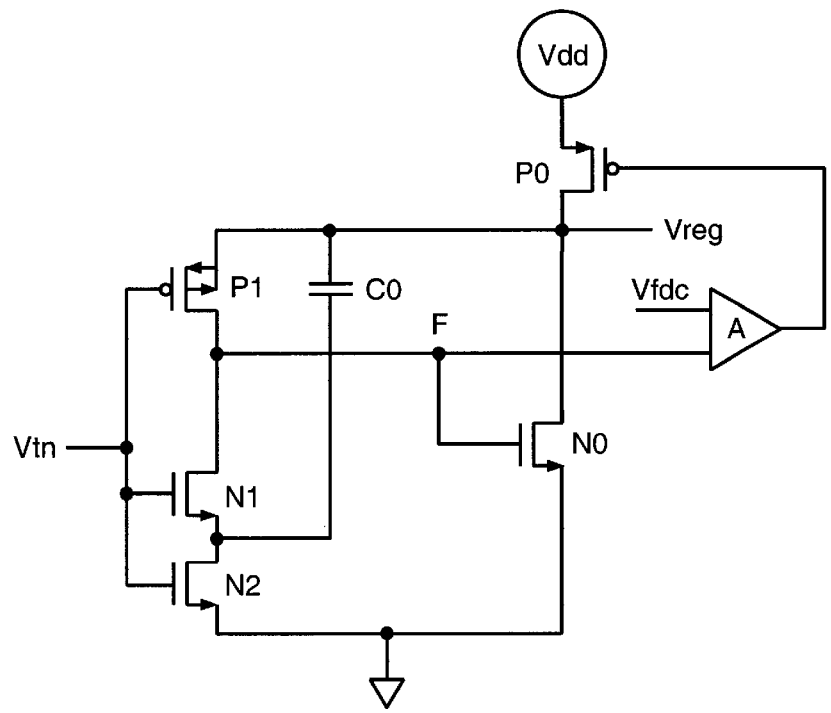
FIG._1  Voltage Regulator
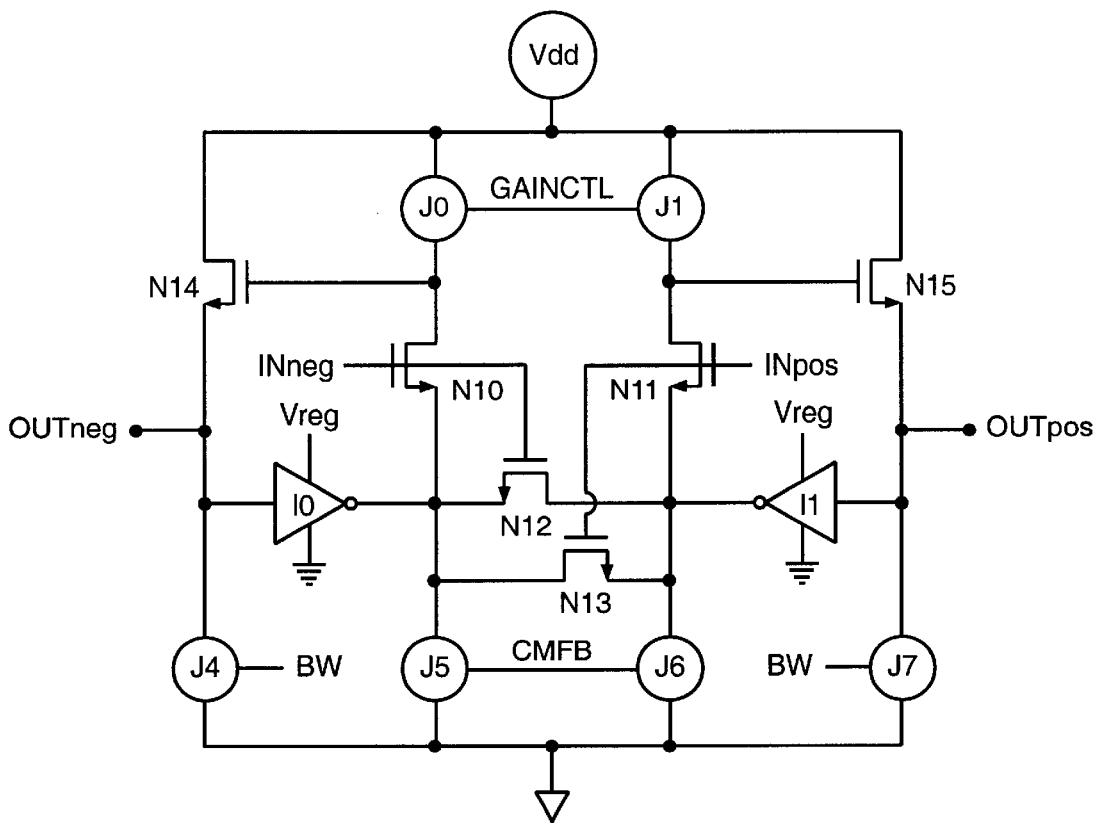
FIG._2  Variable Gain Amplifier

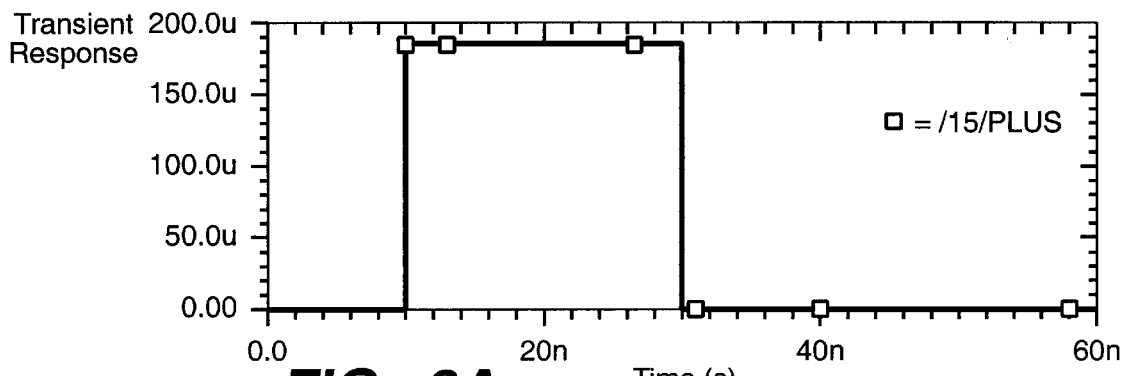
FIG._3A
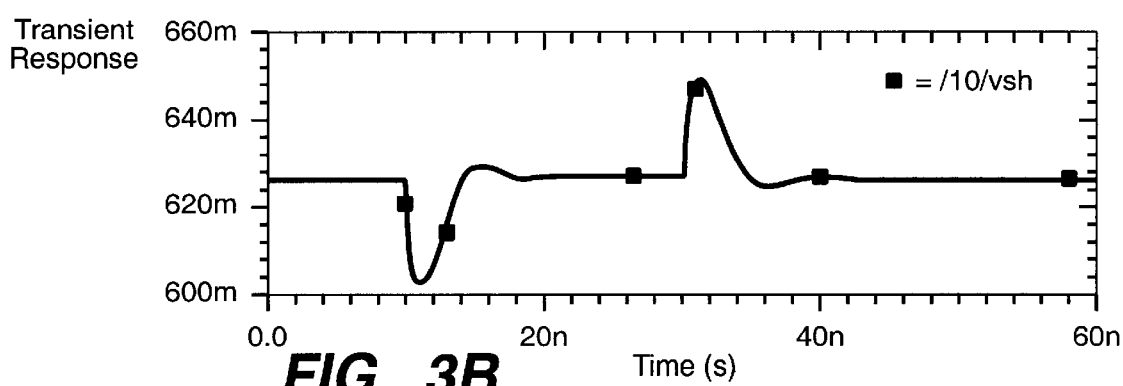
FIG._3B
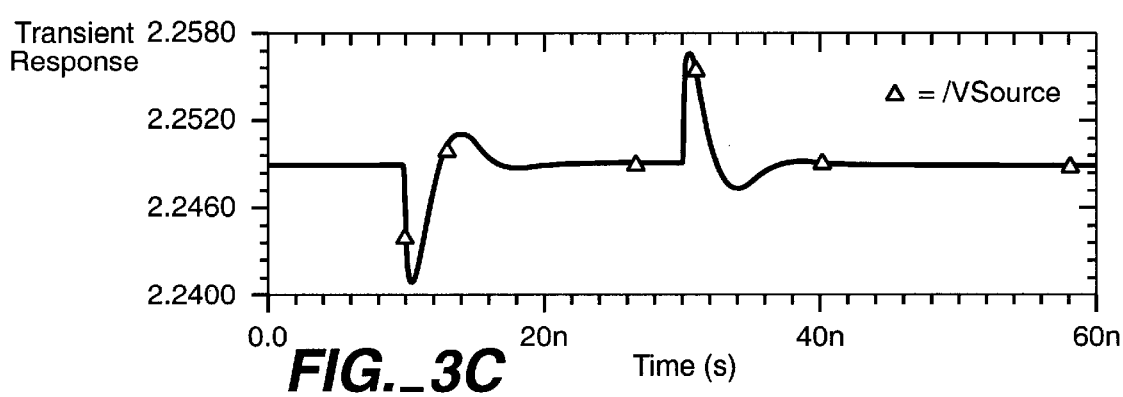
FIG._3C
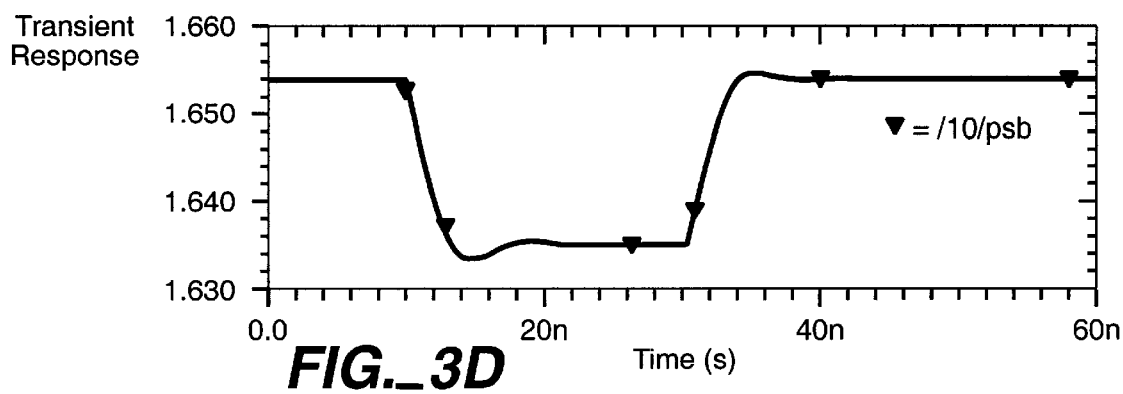
FIG._3D

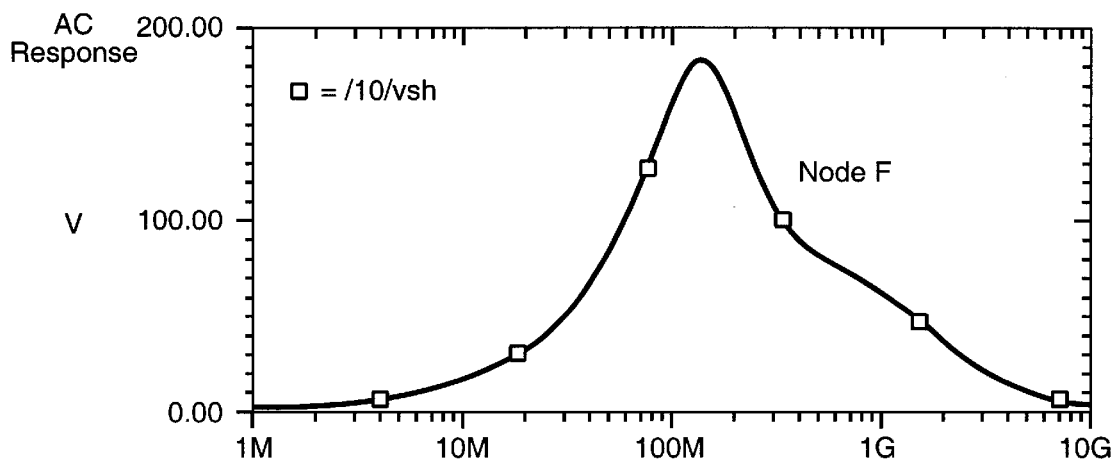
FIG._4A
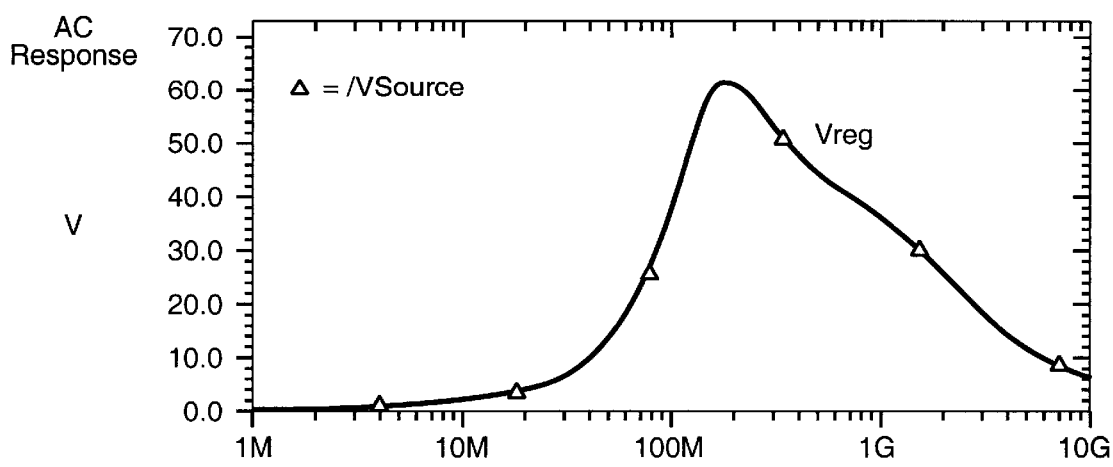
FIG._4B
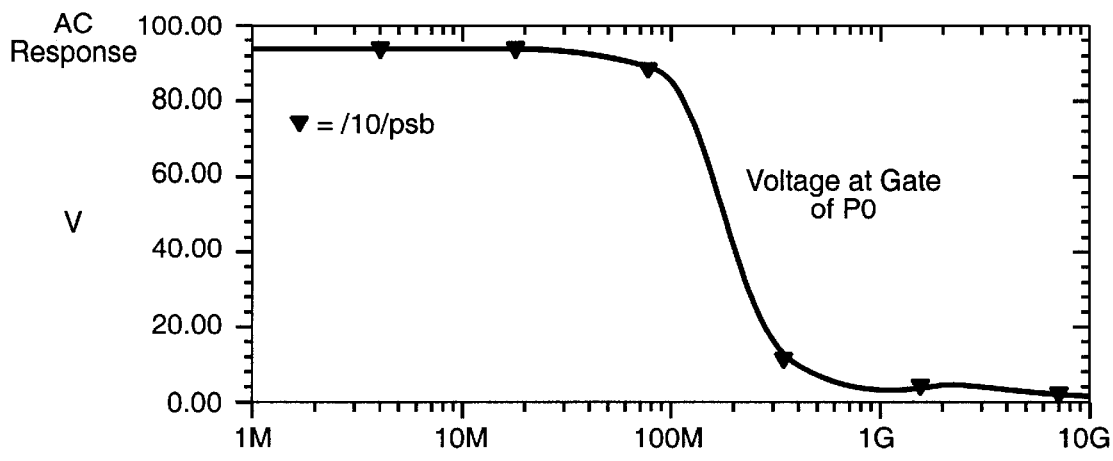
FIG._4C

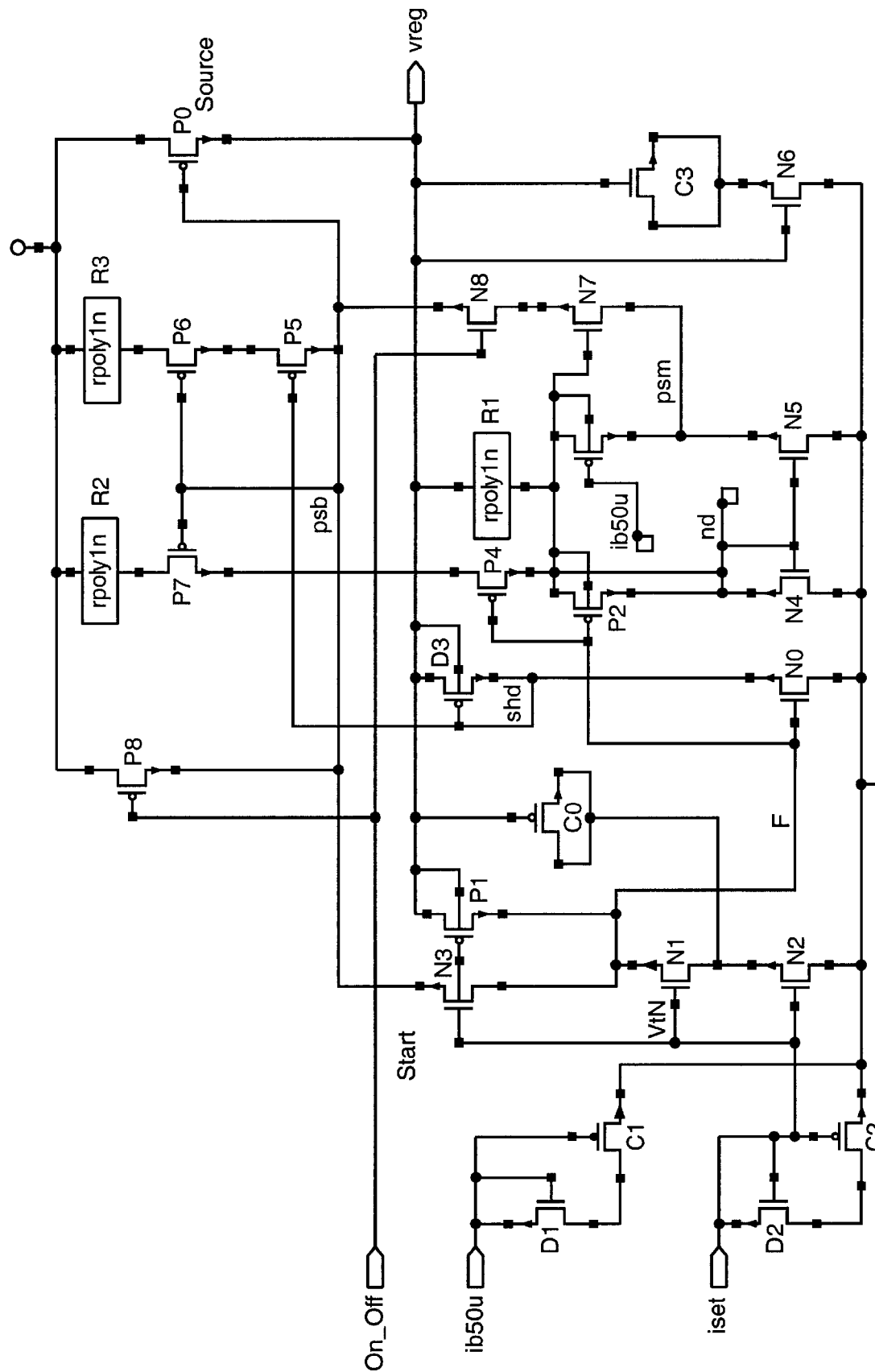
FIG._5

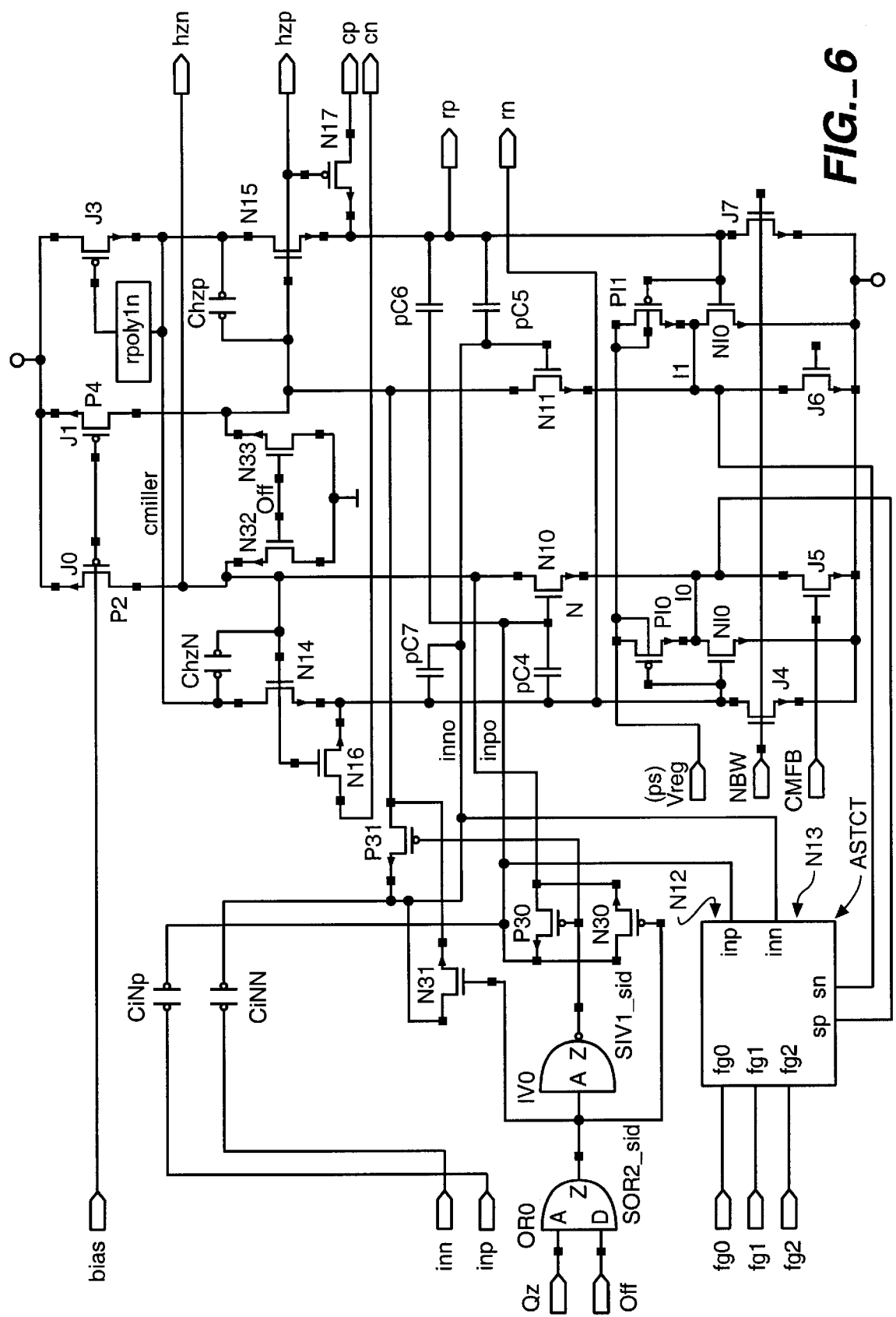
FIG._6

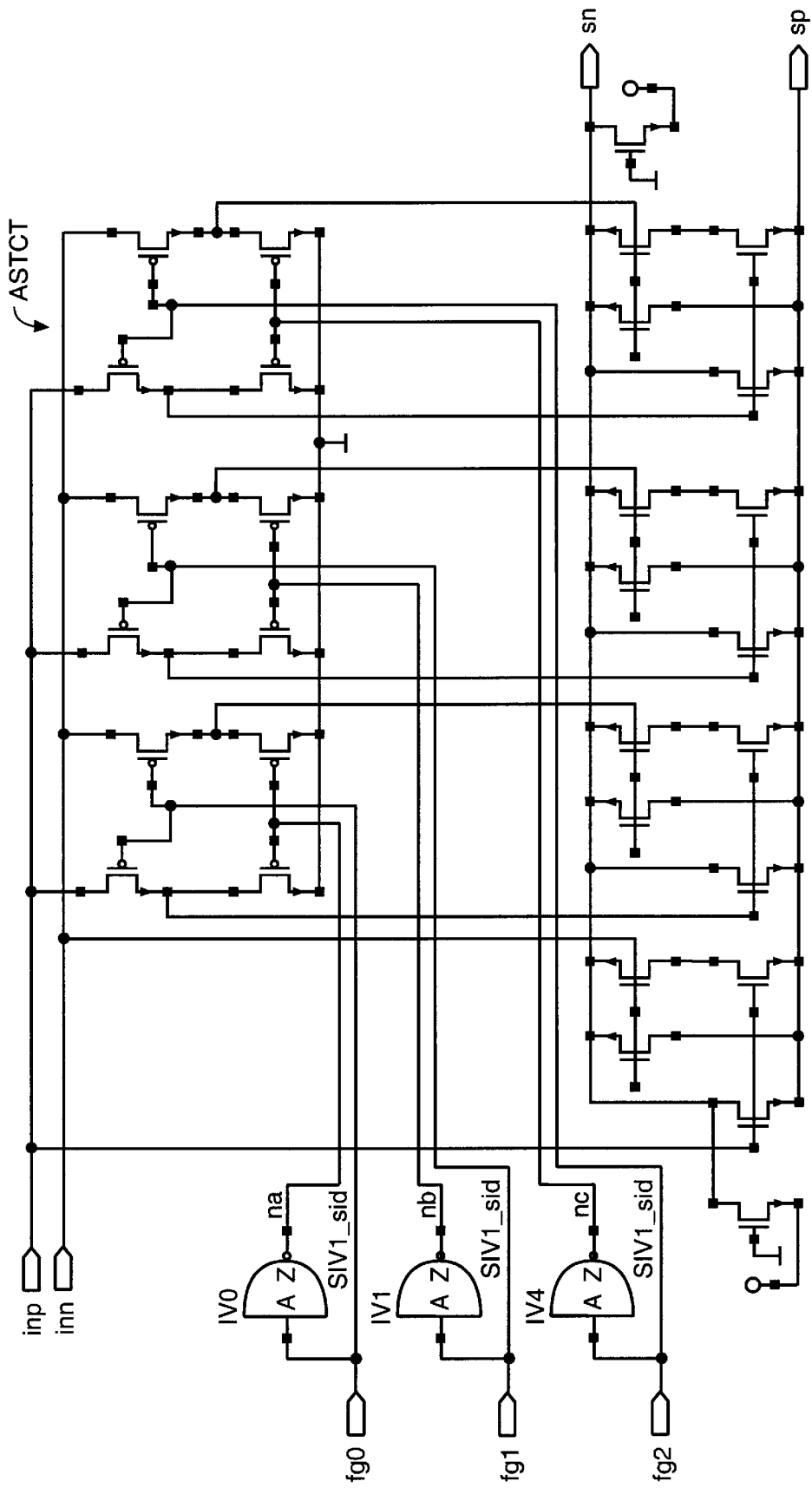
FIG._7

METHOD AND APPARATUS FOR AN IMPROVED VARIABLE GAIN AMPLIFIER

FIELD OF THE INVENTION

The present invention relates to the field of electrical circuits. In one embodiment, the invention relates to a method or apparatus for providing a variable gain amplifier. In a further embodiment, the invention relates to using a novel complementary metal oxide semiconductor (CMOS) voltage regulator to provide a stable voltage source for a variable gain amplifier.

BACKGROUND OF THE INVENTION

Variable gain amplifier (VGA) circuits are useful in many applications. One particular application is in rechannel cores for disk drives. As is known in the art, such rechannel cores may be embodied as integrated circuits for use in a disk drive. As is known in the art, from the reading head of the disk drive at the edge of the reader arm, an analog-to-analog fixed gain amplifier resides at the disk drive read/write arm. After the read amplifier, a second amplifier is configured to give a constant output signal level. In order for this second amplifier to provide a constant output, it must have a variable gain because the magnitude of the input will vary according to varying operating parameters, such as the head of the disk drive flying closer or further from the magnetic surface, variations in preamplifier gain, or other varying operating parameters.

D. R. Welland et al., "A Digital Read/Write Channel with EEPR4 Detection," *ISSCC Dig. Tech. Papers,* February 1994, pp. 276–277, discusses one rechannel circuit design. The Welland paper, FIG. 2 in particular, shows a structure with NMOS inputs, current source loads, source followers, dual single ended feedback, and NMOS GDS sets input transconductance. However, the circuit shown has a current output, an NMOS feedback, and a static control voltage (VCON). This circuit is therefore not suitable for some applications, particularly because common mode input signals modulate the conductance of the gain setting transistor. The present invention instead ties gain control to the VGS of the input NMOS the current sources relative to the CMOS feedback supply voltage regulator, giving superior performance.

G. Vishakhadatta et al., "An EPR4 Read/Write Channel with Digital Timing Recovery," *IEEE J Solid-State Circuits,* Vol. 33, No. 11 November 1998 pp. 1851–1857 discusses (see FIG. 4, p. 1154) a circuit with an input stage that has some similarities to the present invention, but with voltage outputs from the source follower gates, and replacing the NMOS gain control of Welland with a resistor for better linearity. However, the resistor has a fixed conductance, requiring the gain to be set in the feedback devices. In that VGA, I1 & I2, the tail current is used to set the gain, but in an inverse relationship to the present invention, because the current through the input devices sets the feedback conductance, rather than the input conductance.

F. Krummenacher, "A 4 MHz Continuous-time filter with on-chip automatic tuning," IEEE Journal of Solid-State Circuits, vol. SC-23, pp. 750–758, June 1988, discusses using two NMOS in triode with gates to inputs to linearize transconductance.

What is needed is a method or apparatus that can provide variable gain amplification with high bandwidth, efficiency, and controllable gain and bandwidth.

SUMMARY OF THE INVENTION

In one aspect, the present invention provides a method and apparatus for a differential amplifier designed to have a well-regulated common mode output. The invention has particular applications to CMOS integrated circuits used in data reading devices, where it has traditionally been difficult to achieve a low impedance/high frequency voltage source.

In another aspect, the invention provides a method or device for using a variable gain amplifier with a regulated voltage source that has good stability over a wide bandwidth of load changes. The invention has particular applications to CMOS integrated circuits, where it has traditionally been difficult to achieve a low impedance/high frequency voltage source.

The present invention may also be embodied as a digital data storage device, such as a disk drive. Digital data storage devices that record data on a media are ubiquitous in computing, and audio and video signal recording. Such devices include a controller, a read/write head, a mechanism for moving the media in relation to the head, and a media, such as a tape or disk, that can record signals encoding the digital data. A data storage device according to the present invention, provides improved performance due to its improved reading of the physical media.

The present invention may also be embodied as an integrated circuit (IC). Integrated circuits are well known in the art as devices that can perform a wide variety of digital, analog, or digital/analog functions. An IC according to the present invention has improved electrical signal handling capabilities as described above.

In a more specific embodiment, the present invention is a rechannel IC or rechannel IC core for use in a data storage device. A rechannel receives digital bytes from a computing device and encodes those bytes into signals that may be recorded onto a physical media such as a disk drive platter. A rechannel IC or rechannel core built according to the present invention, has improved reading performance because of the good linearity and high bandwidth of the circuit described above.

A further understanding of the invention can be had from the detailed discussion of specific embodiments below.

BRIEF DESCRIPTION OF THE DRAWINGS

FIG. 1 is a simple block diagram of a voltage regulator according to an embodiment of the invention.

FIG. 2 is a simple block diagram of a variable gain amplifier according to an embodiment of the invention.

FIGS. 3A, 3B, 3C and 3D are simulation graphs illustrating a method of the invention.

FIGS. 4A, 4B and 4C are simulation graphs illustrating the delta response under small signal analysis normalized to 1 amp load of a specific implementation of the invention showing transient response, AC response, and DC response.

FIG. 5 is a detailed block diagram of an exemplary voltage regulator according to an embodiment showing additional and optional components.

FIG. 6 is a more detailed block diagram of a variable gain amplifier according to an embodiment of the invention and showing additional circuitry.

FIG. 7 is a detailed block diagram showing adjustable size transconductance transistors used in a variable gain amplifier according to an embodiment of the invention.

DESCRIPTION OF SPECIFIC EMBODIMENTS

For purposes of clarity, this discussion refers to devices, methods, and concepts in terms of specific examples. However, the method of the present invention may operate in a wide variety of applications. It is therefore intended that the invention not be limited except as provided in the attached claims.

Furthermore, it is well known in the art that analog systems can include a wide variety of different components and different functions in a modular fashion. Different embodiments of the present invention can include different mixtures of elements and functions and may group various functions as parts of various elements. For purposes of clarity, the invention is described in terms of systems that include different innovative components and innovative combinations of components. No inference should be taken to limit the invention to combinations containing all of the innovative components listed in any illustrative embodiment in this specification. Furthermore, it is well known in the art of integrated circuit design that elements such as resistive elements or capacitive elements can be constructed in a variety of ways, using different fabrication techniques or different basic circuits. A resistive element, for example, may be constructed from a particular doped region and may be constructed from an active element, such as a transistor. The disclosure of a particular construction of an element such as a resistor, diode, capacitor, for example should not be taken to limit the invention to that particular construction unless so provided in the attached claims. All publications, patents, and patent applications cited herein are hereby incorporated by reference in their entirety for all purposes.

Wide Band Class AB CMOS Series Shunt Regulator

In one aspect, the invention is able to provide a voltage source in CMOS that has good stability at high frequencies. Traditionally, it has been difficult to get a low impedance/high frequency voltage source in CMOS. Proposed prior solutions have utilized a diode because that was the best frequency source in CMOS that could be achieved. However, use of a diode creates problems because its constant impedance is relatively high at low frequency and DC.

FIG. 1 illustrates a CMOS circuit for providing a regulated voltage ($V_{reg}$) according to one embodiment of the invention. The circuit shown in FIG. 1 can be understood from a number of different perspectives. This circuit may be understood as a CMOS shunt regulator that receives a reference voltage ($V_{tn}$) as an input and outputs double that voltage ($V_{reg}$), maintaining a nearly steady voltage under varying load conditions. Thus $V_{reg}$ can act as a voltage source in many applications.

According to one perspective, and for purposes of discussion, the circuit can be thought of as consisting of an input stage, an intermediate node, and a dependent series regulator output stage.

Input Stage

In one embodiment, what can be thought of as the input stage comprises transistors P1, N1, and N2. During normal operation, gate input voltage $V_{tn}$ is maintained at the threshold voltage of an NMOS device (in a specific embodiment approximately 0.7 volts, but is variable from about 0.6 to about 1.2 volts). In one embodiment, $V_{tn}$ is provided by a diode-connected NMOS transistor with a variable input (drain) current. In one application of this aspect of the invention, as discussed below, this variable input current is controlled by a gain control bias circuit.

In an alternative embodiment, the $V_{tn}$ voltages on P1, N1, and N2 may differ slightly. For example, if the gate voltage on N2 is increased by about 100 millivolts, the higher drain voltage at N1 causes a lower drain conductance and better efficiency on the capacitor C0 transferring charge to node F. In another example, a small change in the gate of P1 will raise or lower the output voltage $V_{reg}$ without significant change in the operating currents in any transistor.

At the operating voltages, transistors P1, N1, N2 are all on and operate somewhat like an inverter during a transition phase, and having a voltage gain. In one specific embodiment, N1, N2, and P1 are all operating at the same DC current level and are of similar sizes. As can be seen from the circuit, the source of P1, which would generally be connected to a power supply for a standard inverter, is here connected to $V_{reg}$, which as discussed below is the output node of the circuit.

The input stage also includes a capacitor C0 according to an embodiment of the invention. As can be seen in the FIG. 1, C0 is connected between the source of P1 ($V_{reg}$) and a point between N1 and N2.

Intermediate Node

The input stage communicates with the gates of the output through an intermediate node, labeled F in FIG. 1. The DC gain at F is largely determined by the gain of transistor P1. (For a transistor, at DC, the gain is the transconductance times the output impedance.) The transconductance here is the change in drain current per the change in input (gate to source) voltage.

At high frequencies, the gain at F is determined by the conductance of P1 plus the conductance of N1 into the capacitance at F. C0 passes $V_{reg}$ to the source of N1, with a phase lead, which adds to the phase margin of the whole regulator and helps to prevent ringing.

Output Stage

In one embodiment, what can be thought of as the output stage is comprised primarily of transistors P0 and N0. As can be seen in FIG. 1, the gates of both P0 and N0 are controlled by F. In one embodiment of the invention, however, the gate of P0 is not connected directly to F, but is instead connected to the output of amplifier A, the input of which is connected to F. P0 in this embodiment thus reacts with a delay and gain to changes at F as compared to N0. The DC gain at the gate of P0 is the product of the gain at F and the gain of differential amplifier A.

Amplifier A acts to regulate the current in N0 regardless of the DC load current on $V_{reg}$. As known in the art, amplifier A operates to equalize its inputs, those inputs being node F and a reference voltage DC voltage provided for node F ($V_{Fdc}$). $V_{Fdc}$ operates to set the DC operating level of F and perform a level shift so that the gate of N0 operates at the DC voltage $V_{Fdc}$. Amplifier A has gain so that node F operates at a well defined DC voltage independently of load $V_{reg}$, but amplifier A does not have the bandwidth response that the shunt regulator (F driving N0) has.

Amplifier A in an alternative embodiment may be replaced with a PMOS source follower, operating as a level shift, though in this case without the regulation provided by the amplifier.

Operation

According to an embodiment, a method of the invention can be understood according to the operation of a circuit such as shown in FIG. 1. With $V_{tn}$ in the threshold voltage range, P1, N1, and N2 are on and $V_{reg}$ can be considered a primary dynamic input for the circuit. If $V_{reg}$ goes up, it pulls F up with about half the gain of the P1, N1, N2 inverter. But, according to the circuit design shown in FIG. 1, several elements resist $V_{reg}$ moving up and therefore tend to keep $V_{reg}$ stable. These elements, listed in order from fastest response to slowest response, include: (1) the capacitor C0, which places load on $V_{reg}$; (2) the real conductance of the source of P1; and (3) the gain of P1 times the conductance of N0. The weight of any of these factors depends of the frequency of the change in $V_{reg}$.

If $V_{reg}$ gets a sudden change in load, capacitor C0 supplies the initial charge to maintain the voltage at $V_{reg}$. The change in voltage over time (dV/dt) of $V_{reg}$ generally determines the current through C0, which gets summed through N1 into node F. This provides additional loop stability for the whole regulator.

If $V_{reg}$ moves, there is a change in current through P1 because of the change in the source voltage; that current is integrated at F. The current through P1 is proportional to delta $V_{reg}$.

The slowest path is through the gain of P1 multiplied by the gain of A multiplied by the conductance of P0. That path regulates the current in P0, which combines with N0 to provide operation analogous to a class AB amplifier.

Thus node F, which is the gate of N0, responds quickly to load changes of Vreg. Node F tends to move immediately with some gain in response to changes in Vreg, but returns to the operating point after the amplifier A loop adjusts to the new load.

Thus, the invention, as embodied in FIG. 1, can accept a high impedance voltage input $V_{tn}$, which is not capable of steadily driving a large load, and creates a low impedance voltage source at $V_{reg}$ with increased load driving capabilities and fast response to changing loads.

Operations of the circuit also can be understood as resembling the operation of a boosted super beta source follower. Transistors P1 and N0 also can be understood as similar to a complementary darlington, boosted by a capacitor C0 for improved phase margin. In another view, the input stage and N0 operate as a shunt regulator and A with P0 operate as a dependent series regulator.

Variable Gain Amplifier

FIG. 2 illustrates a variable gain amplifier according to another aspect of the invention. This amplifier can utilize the $V_{reg}$ produced by the circuit of FIG. 1 or can use another stable adjustable voltage source, such as a source follower connected transistor.

The circuit shown in FIG. 2 can be understood as a type of differential amplifier. As with many standard differential amplifiers known in the art, the circuit is basically symmetrical. Each half is comprised of three transistors (N10, N12, N14 left; N11, N13, N15 right), an inverter (I0 left and I1 right), and three current sources (J0, J4, J5 left; J1, J6 J7 right). In one embodiment, current sources J can be understood as single transistor current sources.

The circuit shown in FIG. 2 operates as a differential amplifier, with positive input INpos and negative input INneg. As understood in the art, these signals will have a variable common mode amplitude, though the circuit is designed to have a well-regulated common mode output. OUTpos and OUTneg are the paired outputs and provide a gain and common mode rejection of the input signals.

The circuit can be understood as having two summing nodes that sum to zero current, these being the outputs of inverters I0 and I1. However, according to the invention, there will be some current between the two because of the voltage difference at INpos and INneg, which causes drain-to-source voltage difference and proportional drain-to-source current at transistors N12 and N13. Equal opposite current is supplied by the feedback path through inverters I1 and I0. As shown in FIG. 2, $V_{reg}$ is the power supply input for I0 and I1, and thus $V_{reg}$ affects the amount of feedback through the inventors. The gain of the circuit shown in FIG. 2 can be understood as twice the drain conductance of N12 and N13 divided by the conductance of inverters I0 and I1.

In the circuit of FIG. 2, transistors N10 and N11 are input followers, that operate at essentially a regulated current set by J0 and J1, as controlled the bias node signal GAINCTL. The gain of the entire amplifier is the differential currents summed at the source of N10 and N11. Or, alternatively, the gain can be understood as the conductance of N12 and N13 divided by the conductance of inverters I0 and I1. The conductance of the inverters I0 and I1 is controlled by the supply voltage to the inverters, which, as shown, is $V_{reg}$. The drain to source conductance of N12 and N13 changes with the current J0 equal J1. Equal opposite drain conductance changes of N12 and N13 provide improved gain linearity.

GAINCTL

GAINCTL is a signal that controls current sources J0 and J1. In one application, this signal is provided from an external source and is the automatic gain control signal for the entire circuit. In one application, the circuit shown in FIG. 2 may be used as the variable gain amplifier component of an automatic gain control (AGC) loop. As is known in the art, other components of and AGC include an error estimator and an integrator. When the circuit of FIG. 2 is used in an AGC, the signal GAINCTL can be understood to be supplied by the integrator. In one application, the voltage, $V_{reg}$, and GAINCTL both change for increased gain range and/or approximately logarithmic gain control.

As known in the art, automatic gain control may be achieved by passing the output of an amplifier through a filter and then to an analog-to-digital (A/D) converter; the output of the A/D is input to a slicer to estimate the error values. The product of the error term and the slicer value is summed to form the gain error, and that sum controls a D/A converter.

GAINCTL sets the current in J1 and J0. When the circuit of FIG. 1 is used in FIG. 2, GAINCTL may also control the current in a diode that produces $V_{tn}$, causing the voltage $V_{tn}$ to move in the same direction as the signal GAINCTL, so that the current in the $V_{tn}$ NMOS diode varies inversely to the PMOS currents in J1 and J0. This produces a logarithmic gain response. $V_{tn}$ thereby provides additional gain adjustment through the voltage regulator circuit, which modulates the feedback conductance of I0 and I1.

As seen in the figure, the gain to source voltage (Vgs) at N10 and N12 (and at N11 and N13) are the same, and the drain to source voltage (Vds) of N12 and N13 are equal and opposite.

The current sources J4 and J5 are controlled by a signal BW (bandwidth) which provides some bandwidth modulation control. At higher gain, as set by GAINCTL, there is a tendency for the gain to attenuate (or roll-off) for high frequency signals. In one application, the signal BW is dependant on GAINCTL and moves with the gain to boost the gain bandwidth product at higher DC gain settings. This feature helps to reduce the bandwidth variation with gain.

It will be seen from the above that in the circuit of FIG. 2, as in Krummenacher's filter, the variable linear input transconductance provided by N12 and N13 help to make the gain of the circuit more linear. Sizing the PMOS and NMOS in I0 and I1 for similar transconductance makes the feedback linear in the common mode as well as differentially, correcting in the first order at high frequency for common mode variation with large input signals.

CMFB

Common Mode Feed Back (CMFB) is a signal that controls current sources J5 and J6. This signal is generated from the output common mode voltage error in negative feedback. In one application this is a lower frequency loop with common voltage error converted to current and integrated on the dominant pole capacitance at CMFB. In one application the common mode feedback transistors are replaced by inverters.

Operation of VGA shown in FIG. 2

It will be seen from the above that in the circuit of FIG. 2, using complementary feedback provided by inverters I1 and I0, the NMOS and PMOS transistors within I0 and I1 allow class AB operation (with the PMOS transistor as the source and the NMOS as the sink) and therefore constant conductance, providing low distortion. The inverters allow common mode feedback, providing good common mode control. Furthermore, the design allows use of the source follower outputs as low impedance voltage outputs.

Method For Providing A Voltage Source

FIGS. 3A–3D illustrate a method according to the invention and show simulation results for an example circuit embodiment of the invention using a specific example stimulus.

FIG. 3A illustrates a variable load placed on the output $V_{reg}$. This example load jumps sharply from 0 microamps to 200 microamps in a 20 ns square pulse. This current is pulled initially from C0, and this drain causes the voltage at F to drop. In response, node F (at the gate of N0) moves quickly from steady state (in this example circuit, approximately 627 mV) down a small amount (to just over 600 mV) as shown in FIG. 3B. This causes less current to flow through N0, thus making additional current available at $V_{reg}$ to drive the increased load.

FIG. 3C shows the small transient fluctuation in $V_{reg}$ in response to the changed load. As shown in the figure, $V_{reg}$ drops temporarily from its steady state (in this example, about 2.2470 volts) slightly (in this example 2.2400 volts) when the load is first applied, but it is very quickly returned to steady state by the action of N0.

FIG. 3D illustrates the voltage response of the gate of P0 (which is the output of amplifier A). The voltage at the gate of P0 moves more slowly in response to the change in the load because of the delay through amplifier A (and through P0 and P1) in response to the voltage changes at node F. However, as this catches up with the change at node F, amplifier A and P0 together provide greater DC drive capacity (gain) and more steady DC response to the load at $V_{reg}$.

As P0 provides the additional demanded current, node F returns to its steady state value. When the load at $V_{reg}$ drops, at 30 ns, the circuit behaves in an inverse fashion, with C0 absorbing some of the initial excess current, causing an adjustment at the gate of N0 as shown, with subsequent adjustments at amplifier A and the gate of P0.

FIGS. 4A–4C illustrate the frequency gain response of an example circuit constructed according to an embodiment of the invention, to a small signal current load normalized to 1 amp. In each figure, the horizontal axis is a logarithmic frequency axis and the vertical axis can be read as either volts or ohms (volts=amps*ohms).

FIG. 4A shows the normalized frequency gain response at node F. FIG. 4B shows the normalized frequency gain response at $V_{reg}$. FIG. 4C shows the normalized frequency gain response at the output of amplifier A/gate of P0.

Exemplary Specific Embodiment of Wide Band Shunt Regulator

FIG. 5 shows an exemplary specific embodiment of a voltage regulator according to the invention. This embodiment provides a number of additional components over the circuit shown in FIG. 1. Elements commonly labeled in FIG. 5 operate essentially as described above with respect to FIG. 1. FIG. 5 illustrates additional elements and methods of operation, as described below. Below are described the additional elements of this embodiment.

Voltage Signal Generating Circuits

Shown at the lower left of FIG. 5 are two components used in this embodiment to generate the voltages $V_{Fdc}$ and $V_{tn}$.

Ib50 $\mu$ is a 50 microamp bias signal that in this embodiment is input to a diode connected NMOS transistor D1 connected and capacitor C1, both connected to ground as shown. The voltage thus generated across D1 thus is $V_{Fdc}$. This reference gate voltage produces a reference current in one side of the differential amplifier which provides a controlled steady state current in the device.

ISET in this embodiment is a current signal used to generate $V_{tn}$ that, when increased, increases $V_{tn}$. ISET passes through diode connected input transistors D2 (in this specific embodiment four transistors operating together are shown, but other numbers of transistors could be used.) The voltage generated at the gate/source side of these diode connected transistors provides the reference voltage signal $V_{tn}$. The capacitor C2 connected at $V_{tn}$ helps the input stage to resist noise current or load changes that may be capacitively coupled through P1.

Startup Trans

Transistor N3 is a startup transistor. This transistor is used in the circuit because in this embodiment, the amplifier circuit and the inverter circuit transistor P1 are powered by output $V_{reg}$ and is therefore off when $V_{reg}$ is low.

When $V_{reg}$ is low, P1 is off and current will flow through startup transistor N3 instead of P1 directly to the gate of P0 to provide output current at $V_{reg}$. This current will allow P1 to turn on, thus effectively bootstrapping the system. As node F comes into its operating range, N3 turns off.

Note that in FIG. 5 and FIG. 1, the body connection for P1 is specifically shown and is connected to $V_{reg}$. In FIG. 5, the body connection is also shown for P2, P3, D3 etc. As is common in the art, where a body connection is not shown for a PMOS transistor, it is usually assumed that the transistor body is connected to a common power supply.

Diode connection of N0

In this embodiment, rather than connecting the current through N0 directly to $V_{reg}$, a diode connected transistor D3 is placed in series between N0 and $V_{reg}$. D3 accomplishes two things: (1) it generates a voltage that moves in an opposite direction to F but is nominally the same voltage (in operation, both F and the D3 diode voltage are about half $V_{reg}$); and (2) it provides a path for the shunt current. As is known in the art, this can improve the reliability of NMOS transistors because with NMOS transistors, if they have a large drain voltage and large current, the threshold voltage shifts over time. D3 is therefore used to limit the drain voltage on the transistor N0. In this embodiment, the D3 voltage also happens to be a useful voltage to use as a reference for the gate of cascode P5, discussed below.

Specific Embodiment of Amplifier A

The circuit shown in FIG. 5 illustrates one particular embodiment for amplifier A. As described with reference to FIG. 1, however, many alternative configurations for an amplifier A, or for another component to provide current integration, can be used in a regulator according to the invention.

In the configuration shown in FIG. 5, node F and $V_{Fdc}$ are inputs to a differential amplifier with P2 and P3 forming the two differential input transistors and N4 and N5 acting as a current mirror. P4 and P5 are cascode transistors that operate at a diode voltage below $V_{reg}$.

As can be seen from the figure, in this embodiment, the drain and body of P2 and P3 are connected to the output $V_{reg}$ through resistive element R1. R1 regulates the current into P2 and P3 so that if there is a large signal change at F, the resistive value of R1 sets the conductance of A. To illustrate this operation, suppose that F goes very low. If there were then a large current available at the source of P2, then when $V_{reg}$ was recovering, it would overshoot the nominal voltage. If there were just a current source available at the power supply connections, it would be a slow recovery. In this embodiment, the resistive element R1 provides a good compromise of a faster recovery that does not overshoot because the current response is proportional to the error voltage.

Cascode transistors P4 and P5 are used to multiply the impedance of the current mirror. Traditionally, cascode devices are common gate transistors that present a low impedance to the current source device and a high impedance to the current output. P4 is such a common gate device with P2. On the other side of the amplifier, however, P5 is gated not by $V_{Fdc}$, but by the voltage at D3. With the circuit as shown, if node F moves up, the cascode P5 moves down. Thus, the current mirror provides a positive feedback of more than 1:1 only when the circuit requires more current.

Transistor N7 provides a transfer current path, gated by the voltage at R1, between P3 and current source N5. N7 acts as a cascode, transferring current available at its source to the drain at a higher impedance and voltage than would otherwise be practical at the drain of P3.

Cascode Current Sources and Feedback circuits

Transistors P7 and P6, with their collectors connected to resistive elements R2 and R3 respectively, provide the drain currents for cascodes P4 and P5. The gates of P7 and P6 are connected through N7 to one output of the amplifier, herein labeled PSB. This output is also the gate for P0. Thus this configuration provides recirculating feedback though the PMOS and NMOS current mirrors of the amplifier. This recirculating current provides operating current in folded cascode transistor N7.

Output Snubber and Power Down

In this embodiment, the output $V_{reg}$ is also connected to a ground node through a resistive element N6 and a capacitive element C3 in series to provide phase lead on the load as is commonly done on regulator outputs to make them more stable and improve the phase margin so they do not ring. This element is sometimes referred to as a snubber. In this embodiment, the capacitance value for C3 is relatively large.

Transistors P8 and N8 are power down transistors that operate to turn off power through the circuit when their gate signals (signal pu) are low.

Exemplary Specific Embodiment of a Variable Gain Amplifier

FIG. 6 shows an exemplary specific embodiment of a variable gain amplifier according to the invention. This is an alternative embodiment to the circuit shown in FIG. 2, and shows some additional optional elements according to the invention. Elements commonly labeled in FIG. 6 operate essentially as described above with respect to FIG. 2. FIG. 6 illustrates additional elements and methods of operation, as described below. For purposes of ease of discussion, these additional elements are described generally in order from input signals to output signals.

Input Capacitances

Cinp and Cinn are autozero input capacitors that perform a level shift on the inputs prior to those inputs being applied to the gates of N10 and N11. This level shift allows the amplifier to operate with inputs at any input common mode voltage which is desirable because the low impedance outputs are available one threshold below the nominal input voltage in low voltage applications.

Control Signals AZ and OFF and Parasitic Capacitances

OFF and AZ are digital control signals. AZ is the AutoZero input, which connects the gate to the drain on the input transistors, N10 and N11, through the action of switching transistors N30, P30, N31, and P31. This sets the operating point for the input series capacitor, which also holds the offset voltage correction. In operation, periodic autozero pulses may be used to refresh the voltages on the input series capacitors.

OFF is a signal the operates in conjunction with the same switching transistors and N32 and N33 to place the VGA circuit into a "power down" or "sleep mode" state.

A number of parasitic capacitances are shown in FIG. 6, such as pC4, pC5, pC6, and pC7. These capacitances represent inherent capacitances in the manufacture of transistors and interconnect, as is known in the art.

ASTCT

In the embodiment in FIG. 6, block ASTCT (Adjustable Size Transconductance Transistors) replaces N12 and N13 in FIG. 2. As is known in the art, N12 and N13 can be constructed from several parallel transistors, some of which are provided with a digital control input. In the embodiment shown in FIG. 6, digital control signals fg0, fg1, and fg2 can be set to selectively turn off some of these parallel transistors, thus allowing a digital adjustment of the effective size of these transistors. One specific example of how such an ASTCT circuit could be constructed is shown in FIG. 7.

Outputs

The circuit shown in FIG. 6 is provided with three pairs of outputs.

Hzp and Hzn are high impedance outputs from the drains of N10 and N11 and may be used when low drive strength and higher output common mode are appropriate.

RP and RN are the resistive load driving outputs. As seen in the figure, these outputs are coupled to the sources of N14 and N15 and correspond to the outputs shown in FIG. 2. These outputs are optimized for driving resistive loads because of their low impedance in feedback (in one example 40 Ohm).

CP and CN are capacitive load driving outputs. As seen in the figure, these outputs are also coupled to the sources of N14 and N15, but through series resistive loads N16 and N17 that tend to stabilize the CP and CN outputs. These outputs are optimized for driving capacitor loads. The resistive elements in series with the load capacitance, provides some phase lead at CP and CN as well for improved phase margin.

Miller Capacitances

According to a further embodiment of the invention, miller capacitances Chzn and Chzp are placed across the gates of transistors N14 and N15 and a common summing drain node for those transistors, herein labeled CMILLER. CMILLER is operationally connected to a 200 MHz Adaptive Current Source J3 with its gate connected back to CMILLER. Note that, in this embodiment, the drains of N14 and N15 are connected to CMILLER, rather than directly to the power supply as in FIG. 2.

As is known in the art, the Miller Effect generally describes the effect that a feedback capacitance has between the gate and drain (or collector and base or any inverting gain stage) on transistor or other amplifier performance. As is known, the gain of an amplifier increases the effective capacitance value of a feedback miller capacitance, generally in proportion to the gain between the nodes at each side of the miller capacitance. While this effect is sometimes discussed as an undesirable aspect of parasitic capacitances on transistor operation, some circuit designs utilize the miller effect to achieve desired circuit behavior.

In this embodiment of the present invention, Chzn and Chzp operate as miller capacitances across transistors N14 and N15 and according to this aspect of the invention, these capacitances operate to differentiate the behavior of the VGA between common mode signals and differential signals.

According to this aspect, if there is a common mode signal on INN and INP, the gains at N14 and N15 will be of the same sign and will add at node CMILLER and the combined values of Chzn and Chzp will be thus multiplied by the summed gain. Therefore, for common mode signals, Chzn and Chzp are effectively large capacitances due to the miller effect.

However, for differential mode signals, on INN and INP, the currents through of N14 and N15, will be opposite and will cancel each other at CMILLER. The combined feedbacks through Chzn and Chzp will be thus effectively multiplied only by unity, without gain. Therefore, for common mode signals, Chzn and Chzp are effectively small capacitances. The different effective capacitances of Chzn and Chzp thus allow the circuit to effectively stabilize the common mode response and dampen even mid range common mode frequencies, while reducing the bandwidth loss for differential mode operation.

Thus, in this embodiment, the invention uses miller capacitance differentially with a different multiplier for common mode versus differential mode operation of an amplifier. This aspect of the invention provides increased stability at CMILLER and reduces problems associated with common mode oscillations, while maintaining bandwidth. This solution to stabilizing CMILLER has the added advantage that it does not require additional current and instead uses the operating current in the source followers N14 and N15 to power the adaptive current source. The current thus is effectively used twice.

In this example, the design is primarily concerned with reducing high frequency oscillations, so it can utilize an adaptive current source that adapts to provide low impedance at low or middle frequencies. In this design, it is desirable to minimize any stray capacitance at CMILLER or else there is not much gain and therefore a lower multiplication factor for the miller capacitor. The adaptive current source appears inductive in operation, and may be an inductor or as shown herein, a PMOS transistor with a resistor from drain to gate.

Conclusion

The invention has now been explained with regard to specific embodiments. Variations on these embodiments and other embodiments will be apparent to those of skill in the art. The invention therefore should not be limited except as provided in the attached claims. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A variable gain differential amplifier comprising:
   first and second differential amplifier paths, each path comprising:
      an input transistor (N10, N11), the gate of said input transistor coupled to one of paired inputs (INneg, INpos) and said gate coupled to;
      a transconductance transistor (N12, N13) the source and drain of which are coupled between said first and second paths;
      an output transistor (N14, N15) with its gate coupled to said input transistor, and coupled between a power supply and one of paired outputs (OUTneg, OUTpos);
      a feedback inverter (I0, I1) coupled between said one of paired outputs and said input transistor.

2. The device according to claim 1 wherein said first and second differential amplifier paths each further comprise:
   a first current source (J0, J1) coupled to said input transistor;
   a second current source (J5, J6), coupled between said input transistor and ground; and
   a third current source (J4, J7), coupled between said one of paired outputs and ground.

3. The device according to claim 1 wherein said variable gain differential amplifier is fabricated in CMOS.

4. The device according to claim 2 wherein said first current sources are coupled to a gain control signal (GAINCTL).

5. The device according to claim 2 wherein said second current sources are coupled to a common mode feedback control signal (CMFB).

6. The device according to claim 2 wherein said third current sources are coupled to a gain bandwidth adjustment signal (BW).

7. The device according to claim 1 wherein said inverters comprise a PMOS (P10, P11) and an NMOS (N10, N11) transistor.

8. The device according to claim 1 wherein said inverters are coupled at power supply inputs to a regulated voltage reference signal ($V_{reg}$).

9. The device according to claim 8 wherein said regulated voltage reference signal is provided by a voltage source comprising:

first (P0) and second (N0) transistors, connected in series between a supply voltage and a ground and providing a regulated output ($V_{reg}$) at a point between said first and second transistors;

third (P1), fourth (N1), and fifth (N2) transistors, connected in series between Vreg and ground, the gates of said third, fourth, and fifth transistors connected to stable gate voltages ($V_m$), the output of said connected third and fourth transistors defining an internal node (F) voltage operationally connected to the gate of said second transistor;

a feed forward capacitance (C0) connected from said regulated output to a point between said fourth and fifth transistors; and a level shift circuit (A) with an input operationally connected said intermediate node and an output connected to the gate of said first transistor.

10. The device according to claim 1 wherein said tranconductors (N12, N13) are comprised on multiple component transistors that may be digitally switched on an off to adjust their conductance values.

11. The device according to claim 1 further comprising input capacitances (Cinp, Cinn).

12. The device according to claim 1 further comprising:

an adaptive current source (J3) with its output connected to a node (CMILLER) that is the common drain node for said output transistors (N14, N15).

13. The device according to claim 1 further comprising:

a pair of capacitances (Chzn, Chzp) connecting from a common drain node for said output transistors (N14, N15) to gates of each of said output transistors.

14. The device according to claim 1 further comprising:

a pair of capacitances (Chzn, Chzp) connecting from a common drain node for said output transistors (N14, N15) to gates of each of said output transistors that for common mode signals are effectively large capacitances and for differential mode signals are effectively small capacitances.

15. The device according to claim 1 wherein the device uses miller capacitances differentially with a different multiplier for common mode versus differential mode operation thus reducing problems associated with common mode oscillations, while maintaining bandwidth.

16. The device according to claim 1 wherein a common drain node for said output transistors (N14, N15) is stabilized using miller capacitances and an adaptive current source while not requiring additional current and instead using the operating current in said output transistors to power the adaptive current source.

17. The device according to claim 1 further comprising output series resistive loads (N16, N17) for stabilizing the outputs.

18. The device according to claim 1 further comprising shut off transistors (N32, N33) for bringing the circuit to a powered down state.

19. A recording device for recording data or electrical signals having a reading element and a media and providing improved signal reading, comprising:

a variable gain differential amplifier comprising:

first and second differential amplifier paths, each path comprising:

an input transistor (N10, N11), the gate of said input transistor coupled to one of paired inputs (INneg, INpos) and said gate coupled to;

a transconductance transistor (N12, N13) the source and drain of which are coupled between said first and second paths;

an output transistor (N14, N15) with its gate coupled to said input transistor, and coupled between a power supply and one of paired outputs (OUTneg, OUTpos);

a feedback inverter (I0, I1) coupled between said one of paired outputs and said input transistor.

20. An integrated circuit rechannel device comprising:

first and second differential amplifier paths, each path comprising:

an input transistor (N10, N11), the gate of said input transistor coupled to one of paired inputs (INneg, INpos) and said gate coupled to;

a transconductance transistor (N12, N13) the source and drain of which are coupled between said first and second paths;

an output transistor (N14, N15) with its gate coupled to said input transistor, and coupled between a power supply and one of paired outputs (OUTneg, OUTpos);

a feedback inverter (I0, I1) coupled between said one of paired outputs and said input transistor.

* * * * *